(12) United States Patent
Lee et al.

(10) Patent No.: US 8,956,790 B2
(45) Date of Patent: Feb. 17, 2015

(54) POSITIVE PHOTOSENSITIVE RESIN COMPOSITION, AND ORGANIC INSULATOR FILM FOR DISPLAY DEVICE AND DISPLAY DEVICE FABRICATED USING THE SAME

(71) Applicant: Cheil Industries Inc., Gumi-si (KR)

(72) Inventors: Jun-Ho Lee, Uiwang-si (KR); Hyo-Young Kwon, Uiwang-si (KR); Hwan-Sung Cheon, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

(21) Appl. No.: 13/933,721

(22) Filed: Jul. 2, 2013

(65) Prior Publication Data

US 2014/0178816 A1    Jun. 26, 2014

(30) Foreign Application Priority Data

Dec. 24, 2012 (KR) .................. 10-2012-0152458

(51) Int. Cl.
*G03F 7/023* (2006.01)
*G03F 7/004* (2006.01)

(52) U.S. Cl.
CPC .......... *G03F 7/0045* (2013.01); *G03F 7/0233* (2013.01)
USPC ............. 430/18; 430/192; 430/193; 430/326

(58) Field of Classification Search
CPC .................................................. G03F 7/0233
USPC .................... 430/192, 193, 18, 326
See application file for complete search history.

(56) References Cited

U.S. PATENT DOCUMENTS

| | | | |
|---|---|---|---|
| 6,949,325 B2 | 9/2005 | Li et al. | |
| 7,781,142 B2* | 8/2010 | Chiba et al. ............... | 430/270.1 |
| 2004/0053163 A1 | 3/2004 | Fujita | |
| 2004/0253537 A1* | 12/2004 | Rushkin et al. ............ | 430/270.1 |
| 2009/0130590 A1 | 5/2009 | Chen et al. | |
| 2010/0248147 A1 | 9/2010 | Chen et al. | |
| 2010/0310988 A1 | 12/2010 | Abe et al. | |
| 2011/0136952 A1* | 6/2011 | Sugiyama et al. ............ | 524/265 |
| 2011/0294066 A1 | 12/2011 | Hasegawa | |
| 2012/0171614 A1 | 7/2012 | Cha et al. | |
| 2013/0280654 A1* | 10/2013 | Sugiyama et al. ......... | 430/270.1 |

FOREIGN PATENT DOCUMENTS

| | | |
|---|---|---|
| CN | 101861638 A | 10/2010 |
| JP | 2010-126696 A | 6/2010 |
| KR | 10-2006-0081403 A | 7/2006 |
| KR | 10-2011-0122135 A | 11/2011 |
| TW | 201232183 A | 8/2012 |
| WO | 2005/036261 A1 | 4/2005 |
| WO | 2010/092824 A1 | 8/2010 |

OTHER PUBLICATIONS

Search Report in counterpart Taiwanese Application No. 102121339 dated Aug. 19, 2014, pp. 1.

* cited by examiner

*Primary Examiner* — John Chu
(74) *Attorney, Agent, or Firm* — Additon, Higgins & Pendleton, P.A.

(57) ABSTRACT

Disclosed is a positive photosensitive resin composition that includes (A) at least one dissolution controlling agent selected from a compound including a repeating unit represented by the following Chemical Formula 1, a compound including a repeating unit represented by the following Chemical Formula 2, or a combination thereof, (B) a polybenzoxazole precursor, (C) a photosensitive diazoquinone compound, and (D) a solvent. An organic insulator film for a display device manufactured using the same and a display device are also disclosed.

[Chemical Formula 1]

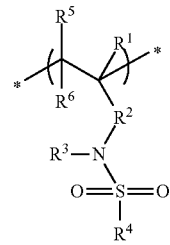

[Chemical Formula 2]

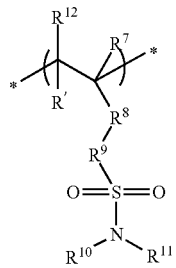

In Chemical Formulae 1 and 2, each substituent is the same as defined in the detailed description.

9 Claims, No Drawings

POSITIVE PHOTOSENSITIVE RESIN COMPOSITION, AND ORGANIC INSULATOR FILM FOR DISPLAY DEVICE AND DISPLAY DEVICE FABRICATED USING THE SAME

RELATED APPLICATIONS

This application claims priority to and the benefit of Korean Patent Application No. 10-2012-0152458 filed in the Korean Intellectual Property Office on Dec. 24, 2012, the entire disclosure of which is incorporated herein by reference.

FIELD

This disclosure relates to a positive photosensitive resin composition, an organic insulator film for a display device using the same, and a display device.

BACKGROUND

Liquid crystal displays (LCDs) used as a flat panel display are generally known. Recently, organic light emitting devices (OLEDs) have been the subject of research since the organic light emitting device (OLED) can have high luminance and may realize full color.

Organic light emitting display devices include organic light emitting devices including a hole injection electrode, an organic emission layer, and an electron injection electrode. Each organic light emitting device emits light by energy generated when exciton produced by binding electrons and holes in the organic emission layer is dropped from the exited state to the base state, and the organic light emitting display (OLED) device expresses a predetermined image using the light emitting.

For example, in order to provide a useful pixilated organic light emitting (OLED) display device such as a television, a computer monitor, a mobile phone display, or a digital camera display, each organic light emitting device may be arranged as a pixel in a matrix format. A monochrome display device may be fabricated so that the pixels emit the same color; or a red, green, blue device may be fabricated so that the pixels emit the various colors.

The organic light emitting device is an emissive type which does not require a backlight unit for emitting light like a liquid crystal display (LCD). Thereby, the organic light emitting device has merits of reducing thickness and weight to a level of 30% of the liquid crystal display.

When preparing a photosensitive resin film for an organic light emitting device, an excessive amount of hydroxyphenols, cresol novolac or the like can be used in order to realize a high sensitivity. Scum, however, may remain after development, and thermal mechanical properties may be deteriorated.

SUMMARY

One embodiment provides a positive photosensitive resin composition that can have high sensitivity and/or excellent scum removal property after development and excellent chemical resistance and moisture permeation resistance.

Another embodiment provides an organic insulator film for a display device manufactured using the positive photosensitive resin composition.

Yet another embodiment provides a display device including the organic insulator film for a display device.

One embodiment provides a positive photosensitive resin composition that includes (A) at least one dissolution controlling agent including a compound including a repeating unit represented by the following Chemical Formula 1, a compound including a repeating unit represented by the following Chemical Formula 2, or a combination thereof; (B) a polybenzoxazole precursor; (C) a photosensitive diazoquinone compound; and (D) a solvent, wherein the dissolution controlling agent (A) is included in an amount of about 5 to about 35 parts by weight based on about 100 parts by weight of the polybenzoxazole precursor (B).

[Chemical Formula 1]

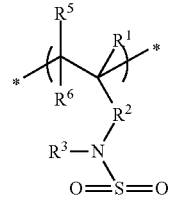

[Chemical Formula 2]

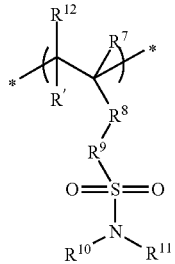

In Chemical Formulae 1 and 2, $R^1$, $R^5$, $R^6$, $R^7$, $R^{12}$ and $R'$ are the same or different and are independently hydrogen, substituted or unsubstituted C1 to C20 alkyl, or substituted or unsubstituted C1 to C20 fluoroalkyl, $R^2$ and $R^8$ are the same or different and are independently —CO—, —COO—, —OCO—, —OCO—COO—, or substituted or unsubstituted C1 to C20 alkylene, $R^3$, $R^{19}$ and $R^{11}$ are the same or different and are independently hydrogen, substituted or unsubstituted C1 to C20 alkyl, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, or substituted or unsubstituted C6 to C30 aryl, $R^4$ is substituted or unsubstituted C1 to C20 fluoroalkyl, and $R^9$ is substituted or unsubstituted C1 to C20 fluoroalkylene.

At least one selected from the compound including a repeating unit represented by the above Chemical Formula 1 and the compound including the repeating unit represented by the above Chemical Formula 2 may include about 1 to about 35 mol % of fluorine.

At least one selected from the compound including a repeating unit represented by the above Chemical Formula 1 and the compound including the repeating unit represented by the above Chemical Formula 2 may further include at least one repeating unit represented by the following Chemical Formulae 3-1 to 3-14, or a combination thereof.

[Chemical Formula 3-1]

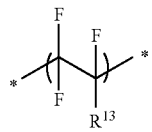

In Chemical Formula 3-1, $R^{13}$ is substituted or unsubstituted C1 to C20 fluoroalkyl.

[Chemical Formula 3-2]

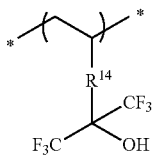

In Chemical Formula 3-2, $R^{14}$ is substituted or unsubstituted C1 to C20 alkylene.

[Chemical Formula 3-3]

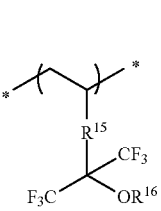

In Chemical Formula 3-3, $R^{15}$ is substituted or unsubstituted C1 to C20 alkylene or substituted or unsubstituted C6 to C30 arylene, and $R^{16}$ is substituted or unsubstituted C1 to C20 alkyl.

[Chemical Formula 3-4]

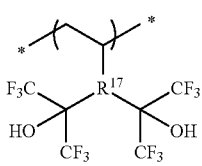

In Chemical Formula 3-4, $R^{17}$ is substituted or unsubstituted C3 to C20 cycloalkylene or substituted or unsubstituted C6 to C30 arylene.

[Chemical Formula 3-5]

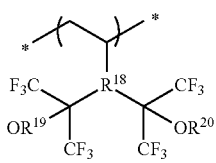

In Chemical Formula 3-5, $R^{18}$ is substituted or unsubstituted C3 to C20 cycloalkylene or substituted or unsubstituted C6 to C30 arylene, and $R^{19}$ and $R^{20}$ are the same or different and are independently substituted or unsubstituted C1 to C20 fluoroalkyl.

[Chemical Formula 3-6]

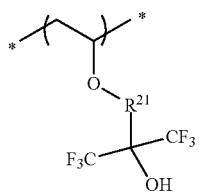

In Chemical Formula 3-6, $R^{21}$ is substituted or unsubstituted C1 to C20 alkylene, substituted or unsubstituted C3 to C20 cycloalkylene, or substituted or unsubstituted C6 to C30 arylene.

[Chemical Formula 3-7]

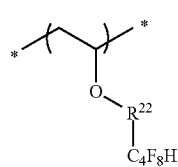

In Chemical Formula 3-7, $R^{22}$ is —$R^{a}OR^{b}$—, and $R^{a}$ and $R^{b}$ are the same or different and are each independently substituted or unsubstituted C1 to C20 alkylene.

[Chemical Formula 3-8]

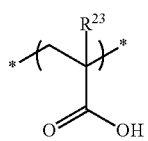

In Chemical Formula 3-8, $R^{23}$ is substituted or unsubstituted C1 to C10 fluoroalkyl.

[Chemical Formula 3-9]

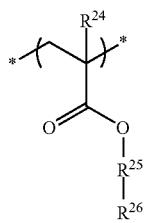

In Chemical Formula 3-9, $R^{24}$ is hydrogen, substituted or unsubstituted C1 to C10 alkyl or substituted or unsubstituted C1 to C10 fluoroalkyl, $R^{25}$ is a single bond or substituted or unsubstituted C1 to C20 alkylene, and $R^{26}$ is substituted or unsubstituted C1 to C20 fluoroalkyl.

[Chemical Formula 3-10]

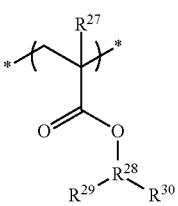

In Chemical Formula 3-10,

R$^{27}$ is hydrogen, substituted or unsubstituted C1 to C10 alkyl, or substituted or unsubstituted C1 to C10 fluoroalkyl, R$^{28}$ is substituted or unsubstituted C1 to C20 alkylene, and R$^{29}$ and R$^{30}$ are the same or different and are each independently substituted or unsubstituted C1 to C20 fluoroalkyl.

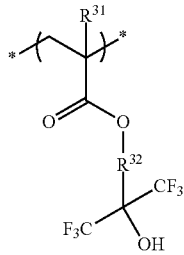

[Chemical Formula 3-11]

In Chemical Formula 3-11,

R$^{31}$ is hydrogen, substituted or unsubstituted C1 to C10 alkyl, or substituted or unsubstituted C1 to C10 fluoroalkyl, R$^{32}$ is substituted or unsubstituted C1 to C20 alkylene, substituted or unsubstituted C1 to C20 fluoroalkylene, substituted or unsubstituted C3 to C20 cycloalkylene, substituted or unsubstituted C3 to C20 fluorocycloalkylene, substituted or unsubstituted C6 to C30 arylene, or substituted or unsubstituted C6 to C30 fluoroarylene.

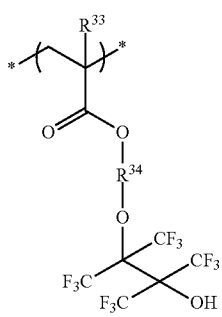

[Chemical Formula 3-12]

In Chemical Formula 3-12,

R$^{33}$ is hydrogen, substituted or unsubstituted C1 to C10 alkyl, or substituted or unsubstituted C1 to C10 fluoroalkyl, and R$^{34}$ is substituted or unsubstituted C1 to C20 alkylene.

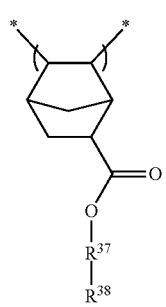

[Chemical Formula 3-13]

In Chemical Formula 3-13,

R$^{37}$ is substituted or unsubstituted C1 to C20 alkylene, and

R$^{38}$ is substituted or unsubstituted C1 to C20 fluoroalkyl.

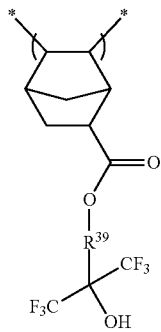

[Chemical Formula 3-14]

In Chemical Formula 3-14, R$^{39}$ is substituted or unsubstituted C1 to C20 alkylene.

The dissolution controlling agent may have a weight average molecular weight of about 3,000 to about 30,000 g/mol.

The polybenzoxazole precursor may include a repeating unit represented by the following Chemical Formula 4, a repeating unit represented by the following Chemical Formula 5, or a combination thereof.

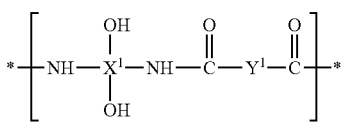

[Chemical Formula 4]

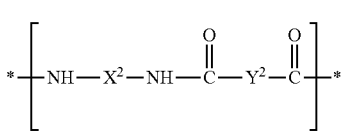

[Chemical Formula 5]

In Chemical Formulae 4 and 5, each X$^{1}$ is independently a substituted or unsubstituted C6 to C30 aromatic organic group, a substituted or unsubstituted tetravalent to hexavalent C1 to C30 aliphatic organic group, or substituted or unsubstituted tetravalent to hexavalent C3 to C30 alicyclic organic group, each X$^{2}$ is independently a substituted or unsubstituted C6 to C30 aromatic organic group, a substituted or unsubstituted divalent to hexavalent C1 to C30 aliphatic organic group, a substituted or unsubstituted divalent to hexavalent C3 to C30 alicyclic organic group, or an organic silane group, and Y$^{1}$ and Y$^{2}$ are the same or different and are each independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

The polybenzoxazole precursor may have a weight average molecular weight of about 3,000 to about 300,000 g/mol.

The positive photosensitive resin composition may include about 5 to about 35 parts by weight of the dissolution controlling agent (A), about 5 to about 100 parts by weight of the photosensitive diazoquinone compound (C) and about 100 to about 900 parts by weight of the solvent (D), based on about 100 parts by weight of the polybenzoxazole precursor (B).

Another embodiment provides an organic insulator film for a display device manufactured using the positive photosensitive resin composition.

Yet another embodiment provides a display device including the organic insulator film for a display device.

Other embodiments are described in the detailed description.

The organic insulator film can have high sensitivity, excellent scum removal property after development and/or excellent chemical resistance and/or moisture permeation resistance. The organic insulator film may be used for a display device, for example, an organic light emitting device.

DETAILED DESCRIPTION

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "substituted" may refer to one substituted with at least a substituent including (—F, —Cl, —Br or —I), a hydroxy group, a nitro group, a cyano group, an amino group ($NH_2$, $NH(R^{200})$, or $N(R^{201})(R^{202})$, wherein $R^{200}$, $R^{201}$ and $R^{202}$ are the same or different and are independently C1 to C10 alkyl), an amidino group, a hydrazine group, a hydrazine group, a carboxyl group, substituted or unsubstituted alkyl, substituted or unsubstituted alkenyl, substituted or unsubstituted alkynyl, a substituted or unsubstituted alicyclic organic group, substituted or unsubstituted aryl, a substituted or unsubstituted heterocyclic group, or a combination thereof in place of at least one of hydrogen of a functional group.

As used herein, when a specific definition is not otherwise provided, the term "alkyl" may refer to C1 to C30 alkyl, for example C1 to C15 alkyl, the term "cycloalkyl" may refer to C3 to C30 cycloalkyl, for example C3 to C18 cycloalkyl, the term "alkoxy" may refer to C1 to C30 alkoxy, for example C1 to C18 alkoxy, the term "aryl" may refer to C6 to C30 aryl, for example C6 to C18 aryl, the term "alkenyl" may refer to C2 to C30 alkenyl, for example C2 to C18 alkenyl, the term "alkylene" may refer to C1 to C30 alkylene, for example C1 to C18 alkylene, the term "arylene" may refer to C6 to C30 arylene, for example C6 to C16 arylene, and the term "alkynyl" may refer to C2 to C30 alkynyl, for example C2 to C15 alkynyl.

As used herein, when a specific definition is not otherwise provided, the term "aliphatic organic group" may refer to C1 to C30 alkyl, C2 to C30 alkenyl, C2 to C30 alkynyl, C1 to C30 alkylene, C2 to C30 alkenylene, or C2 to C30 alkynylene, for example C1 to C15 alkyl, C2 to C15 alkenyl, C2 to C15 alkynyl, C1 to C15 alkylene, C2 to C15 alkenylene, or C2 to C15 alkynylene, the term "alicyclic organic group" may refer to C3 to C30 cycloalkyl, C3 to C30 cycloalkenyl, C3 to C30 cycloalkynyl, C3 to C30 cycloalkylene, C3 to C30 cycloalkenylene, or C3 to C30 cycloalkynylene, for example C3 to C15 cycloalkyl, C3 to C15 cycloalkenyl, C3 to C15 cycloalkynyl, C3 to C15 cycloalkylene, C3 to C15 cycloalkenylene, or C3 to C15 cycloalkynylene, the term "aromatic organic group" may refer to C6 to C30 aryl or C6 to C30 arylene, for example C6 to C16 aryl or C6 to C16 arylene, the term "heterocyclic group" may refer to C2 to C30 heterocloalkyl, C2 to C30 heterocycloalkylene, C2 to C30 heterocycloalkenyl, C2 to C30 heterocycloalkenylene, C2 to C30 heterocycloalkynyl, C2 to C30 heterocycloalkynylene, C2 to C30 heteroaryl, or C2 to C30 heteroarylene that include 1 to 3 heteroatoms including O, S, N, P, Si, or a combination thereof, in one ring, for example C2 to C15 heterocycloalkyl, C2 to C15 heterocycloalkylene, C2 to C15 heterocycloalkenyl, C2 to C15 heterocycloalkenylene, C2 to C15 heterocycloalkynyl, C2 to C15 heterocycloalkynylene, C2 to C15 heteroaryl, or C2 to C15 heteroarylene that include 1 to 3 heteroatoms including O, S, N, P, Si, or a combination thereof in one ring.

As used herein, when a specific definition is not otherwise provided, the terms "fluoroalkyl", "fluoroalkylene", "fluorocycloalkylene", "fluoroarylene", "fluoroalkoxy" and "fluoroalcohol" are each alkyl, alkylene, cycloalkylene, arylene, alkoxy, and alcohol, respectively, that have one or more fluorine substitutents.

A positive photosensitive resin composition according to one embodiment includes (A) a dissolution controlling agent, (B) a polybenzoxazole precursor, (C) a photosensitive diazoquinone compound, and (D) a solvent.

Hereinafter, each component is described in detail.

(A) Dissolution Controlling Agent

The dissolution controlling agent may include a compound including a repeating unit represented by the following Chemical Formula 1, a compound including a repeating unit represented by the following Chemical Formula 2, or a combination thereof.

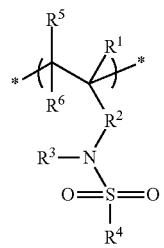

[Chemical Formula 1]

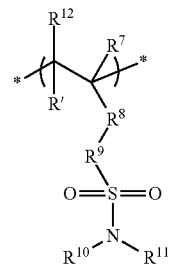

[Chemical Formula 2]

In Chemical Formulae 1 and 2, $R^1$, $R^5$, $R^6$, $R^7$, $R^{12}$ and $R'$ are the same or different and are each independently hydrogen, substituted or unsubstituted C1 to C20 alkyl, or substituted or unsubstituted C1 to C20 fluoroalkyl, $R^2$ and $R^8$ are the same or different and are each independently —CO—, —COO—, —OCO—, —OCO—COO—, or substituted or unsubstituted C1 to C20 alkylene, $R^3$, $R^{10}$ and $R^{11}$ are the same or different and are each independently hydrogen, substituted or unsubstituted C1 to C20 alkyl, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, or substituted or unsubstituted C6 to C30 aryl, $R^4$ is substituted or unsubstituted C1 to C20 fluoroalkyl, and $R^9$ is substituted or unsubstituted C1 to C20 fluoroalkylene.

When a fluorine-containing compound such as a compound including the repeating unit represented by Chemical Formula 1 and/or a compound including the repeating unit represented by Chemical Formula 2 is added to a positive photosensitive resin composition as a dissolution controlling agent, the dissolution controlling agent of the positive photosensitive resin composition may be distributed in a coating on a substrate, and the fluorine atom(s) distributed on the surface may provide water repellency, so that the moisture permeation to water may be prevented; the organic insulator film may have a high sensitivity and excellent chemical resistance; and/or minimal or no scum may remain after development in the patterning process.

At least one of the compound including a repeating unit represented by the above Chemical Formula 1 and the compound including the repeating unit represented by the above Chemical Formula 2 may include about 1 to about 35 mol %, for example about 5 to about 30 mol %, of fluorine. When at least one of the of the compound including a repeating unit represented by the above Chemical Formula 1 and the compound including the repeating unit represented by the above Chemical Formula 2 include fluorine atoms in an amount within the above range, a positive photosensitive resin composition having excellent chemical resistance and/or moisture permeation resistance may be obtained.

The dissolution controlling agent may be a homopolymer which is polymerized using only repeating units represented by Chemical Formula 1 or a homopolymer which is polymerized using only repeating units represented by Chemical Formula 2; or a copolymer which is polymerized using a repeating unit represented by Chemical Formula 1 and a different kind of repeating unit or a copolymer which is polymerized using a repeating unit represented by Chemical Formula 2 and a different kind of repeating unit.

When the dissolution controlling agent is a copolymer, at least one compound including the repeating unit represented by the above Chemical Formula 1 and/or a compound including a repeating unit represented by the above Chemical Formula 2 may further include at least one repeating unit represented by the following Chemical Formulae 3-1 to 3-14, or a combination thereof.

[Chemical Formula 3-1]

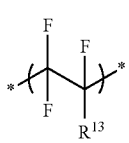

In Chemical Formula 3-1, $R^{13}$ is substituted or unsubstituted C1 to C20 fluoroalkyl.

[Chemical Formula 3-2]

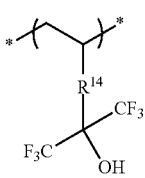

In Chemical Formula 3-2, $R^{14}$ is substituted or unsubstituted C1 to C20 alkylene.

[Chemical Formula 3-3]

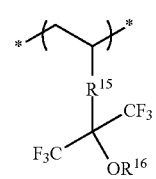

In Chemical Formula 3-3, $R^{15}$ is substituted or unsubstituted C1 to C20 alkylene or substituted or unsubstituted C6 to C30 arylene, $R^{16}$ is substituted or unsubstituted C1 to C20 alkyl.

[Chemical Formula 3-4]

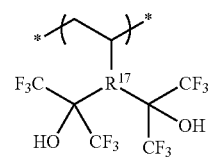

In Chemical Formula 3-4, $R^{17}$ is substituted or unsubstituted C3 to C20 cycloalkylene or substituted or unsubstituted C6 to C30 arylene.

[Chemical Formula 3-5]

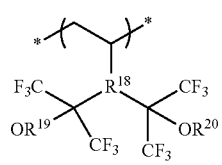

In Chemical Formula 3-5, $R^{18}$ is substituted or unsubstituted C3 to C20 cycloalkylene or substituted or unsubstituted C6 to C30 arylene, and $R^{19}$ and $R^{20}$ are the same or different and are each independently substituted or unsubstituted C1 to C20 fluoroalkyl.

[Chemical Formula 3-6]

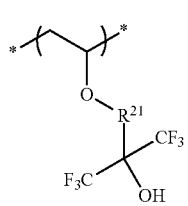

In Chemical Formula 3-6, $R^{21}$ is substituted or unsubstituted C1 to C20 alkylene, substituted or unsubstituted C3 to C20 cycloalkylene, or substituted or unsubstituted C6 to C30 arylene.

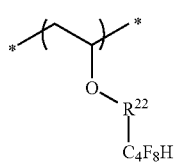
[Chemical Formula 3-7]

In Chemical Formula 3-7, $R^{22}$ is —$R^aOR^b$—, wherein $R^a$ and $R^b$ are the same or different and are each independently substituted or unsubstituted C1 to C20 alkylene.

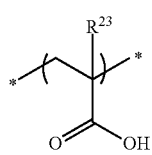
[Chemical Formula 3-8]

In Chemical Formula 3-8, $R^{23}$ is substituted or unsubstituted C1 to C10 fluoroalkyl.

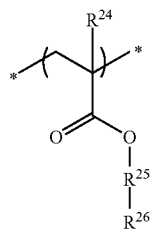
[Chemical Formula 3-9]

In Chemical Formula 3-9, $R^{24}$ is hydrogen, substituted or unsubstituted C1 to C10 alkyl, or substituted or unsubstituted C1 to C10 fluoroalkyl, $R^{25}$ is a single bond or substituted or unsubstituted C1 to C20 alkylene, and $R^{26}$ is substituted or unsubstituted C1 to C20 fluoroalkyl.

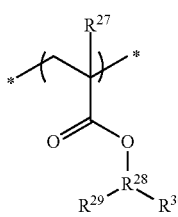
[Chemical Formula 3-10]

In Chemical Formula 3-10, $R^{27}$ is hydrogen, substituted or unsubstituted C1 to C10 alkyl, or substituted or unsubstituted C1 to C10 fluoroalkyl, $R^{28}$ is substituted or unsubstituted C1 to C20 alkylene, and $R^{29}$ and $R^{39}$ are the same or different and are independently substituted or unsubstituted C1 to C20 fluoroalkyl.

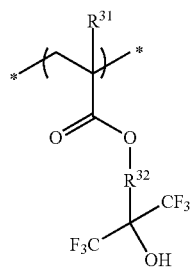
[Chemical Formula 3-11]

In Chemical Formula 3-11, $R^{31}$ is hydrogen, substituted or unsubstituted C1 to C10 alkyl, or substituted or unsubstituted C1 to C10 fluoroalkyl, and $R^{32}$ is substituted or unsubstituted C1 to C20 alkylene, substituted or unsubstituted C1 to C20 fluoroalkylene, substituted or unsubstituted C3 to C20 cycloalkylene, substituted or unsubstituted C3 to C20 fluorocycloalkylene, substituted or unsubstituted C6 to C30 arylene, or substituted or unsubstituted C6 to C30 fluoroarylene.

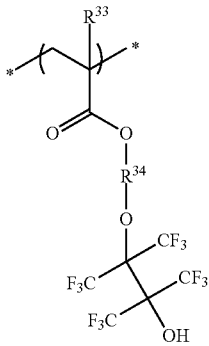
[Chemical Formula 3-12]

In Chemical Formula 3-12, $R^{33}$ is hydrogen, substituted or unsubstituted C1 to C10 alkyl, or substituted or unsubstituted C1 to C10 fluoroalkyl, and $R^{34}$ is substituted or unsubstituted C1 to C20 alkylene.

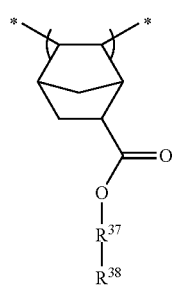
[Chemical Formula 3-13]

In Chemical Formula 3-13,
$R^{37}$ is substituted or unsubstituted C1 to C20 alkylene, and $R^{38}$ is substituted or unsubstituted C1 to C20 fluoroalkyl.

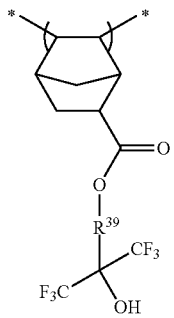

[Chemical Formula 3-14]

In Chemical Formula 3-14, $R^{39}$ is substituted or unsubstituted C1 to C20 alkylene.

The dissolution controlling agent may have a weight average molecular weight of about 3,000 to about 30,000 g/mol, for example about 5,000 to about 30,000 g/mol, and as another example about 5,000 to about 20,000 g/mol. In one embodiment, the dissolution controlling agent may be an oligomer having a weight average molecular weight within the above ranges. The oligomer may improve developability due to a faster dissolution rate than a polymer having a weight average molecular weight within the above ranges.

The positive photosensitive resin composition may include the dissolution controlling agent in an amount of about 5 to about 35 parts by weight, for example about 10 to about 20 parts by weight, based on about 100 parts by weight of the polybenzoxazole precursor that is described hereinafter. In some embodiments, the positive photosensitive resin composition may include the dissolution controlling agent in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, or 35 parts by weight. Further, according to some embodiments of the present invention, the amount of the dissolution controlling agent can be in a range from about any of the foregoing amounts to about any other of the foregoing amounts.

When the positive photosensitive resin composition includes the dissolution controlling agent in an amount within the above range, an organic insulator film having high sensitivity, having minimal or no scum after development and/or having excellent chemical resistance and/or moisture permeation prevention properties can be provided.

(B) Polybenzoxazole Precursor

The polybenzoxazole precursor may include a repeating unit represented by the following Chemical Formula 4, a repeating unit represented by the following Chemical Formula 5, or a combination thereof.

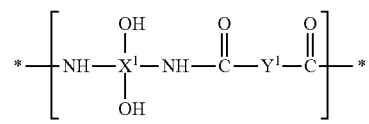

[Chemical Formula 4]

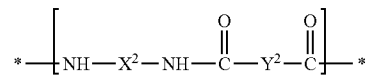

[Chemical Formula 5]

In Chemical Formulae 4 and 5,
each $X^1$ is independently a substituted or unsubstituted C6 to C30 aromatic organic group, a substituted or unsubstituted tetravalent to hexavalent C1 to C30 aliphatic organic group, or substituted or unsubstituted tetravalent to hexavalent C3 to C30 alicyclic organic group, each $X^2$ is independently a substituted or unsubstituted C6 to C30 aromatic organic group, a substituted or unsubstituted divalent to hexavalent C1 to C30 aliphatic organic group, a substituted or unsubstituted divalent to hexavalent C3 to C30 alicyclic organic group, or an organic silane group, and $Y^1$ and $Y^2$ are the same or different and are each independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

The aromatic organic group in $X^1$ and/or $X^2$ of the above Chemical Formulae 4 and 5 may be a residual group derived from aromatic diamine.

Examples of the aromatic diamine may include without limitation 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, 2,2-bis(3-amino-4-hydroxyphenyl)-1,1,1,3,3,3-hexafluoropropane, 2,2-bis(4-amino-3-hydroxyphenyl)-1,1,1,3,3,3-hexafluoropropane, 2,2-bis(3-amino-4-hydroxy-5-trifluoromethylphenyl) hexafluoropropane, 2,2-bis(3-amino-4-hydroxy-6-trifluoromethylphenyl)hexafluoropropane, 2,2-bis(3-amino-4-hydroxy-2-trifluoromethylphenyl)hexafluoropropane, 2,2-bis(4-amino-3-hydroxy-5-trifluoromethylphenyl) hexafluoropropane, 2,2-bis(4-amino-3-hydroxy-6-trifluoromethylphenyl)hexafluoropropane, 2,2-bis(4-amino-3-hydroxy-2-trifluoromethylphenyl)hexafluoropropane, 2,2-bis(3-amino-4-hydroxy-5-pentafluoroethylphenyl) hexafluoropropane, 2-(3-amino-4-hydroxy-5-trifluoromethyl phenyl)-2-(3-amino-4-hydroxy-5-pentafluoroethylphenyl)hexafluoropropane, 2-(3-amino-4-hydroxy-5-trifluoromethylphenyl)-2-(3-hydroxy-4-amino-5-trifluoromethylphenyl)hexafluoropropane, 2-(3-amino-4-hydroxy-5-trifluoromethylphenyl)-2-(3-hydroxy-4-amino-6-trifluoromethylphenyl)hexafluoropropane, 2-(3-amino-4-hydroxy-5-trifluoromethylphenyl)-2-(3-hydroxy-4-amino-2-trifluoromethylphenyl)hexafluoropropane, 2-(3-amino-4-hydroxy-2-trifluoromethyl phenyl)-2-(3-hydroxy-4-amino-5-trifluoromethylphenyl)hexafluoropropane, 2-(3-amino-4-hydroxy-6-trifluoromethylphenyl)-2-(3-hydroxy-4-amino-5-trifluoromethylphenyl)hexafluoropropane, and the like, and combinations thereof.

In Chemical Formula 4, $X^1$ may be a linking group represented by the following Chemical Formula 6, or a linking group represented by the following Chemical Formula 7, but is not limited thereto.

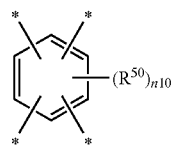

[Chemical Formula 6]

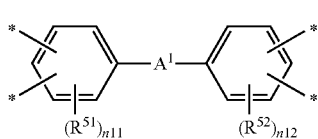

[Chemical Formula 7]

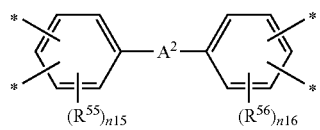

[Chemical Formula 10]

In Chemical Formulae 6 and 7, $A^1$ is a single bond, O, CO, $CR^{47}R^{48}$, $SO_2$ or S, $R^{50}$ to $R^{52}$ are the same or different and each independently hydrogen, substituted or unsubstituted C1 to C30 alkyl, a substituted or unsubstituted C1 to C30 carboxyl group, a hydroxyl group, or a thiol group, $n^{10}$ is an integer of 0 to 2, and each $n^{11}$ and $n^{12}$ is the same or different and is independently an integer of 0 to 3.

The alicyclic organic group in $X^1$ and/or $X^2$ of the above Chemical Formulae 4 and 5 may be a residual group derived from alicyclic diamine.

Examples of the alicyclic diamine may include without limitation 1,2-cyclohexyl diamine, 1,3-cyclohexyl diamine, and the like, and combinations thereof.

The organic silane group in $X^2$ of Chemical Formula 5 may be a residual group derived from silicon diamine.

Examples of the silicon diamine may include without limitation bis(4-aminophenyl)dimethylsilane, bis(4-aminophenyl)tetramethylsiloxane, bis(p-aminophenyl)tetramethyldisiloxane, bis(γ-aminopropyl)tetramethyldisiloxane, 1,4-bis(γ-aminopropyldimethylsilyl)benzene, bis(4-aminobutyl)tetramethyldisiloxane, bis(γ-aminopropyl)tetraphenyldisiloxane, 1,3-bis(aminopropyl)tetramethyldisiloxane, and the like, and combinations thereof.

The aromatic organic group, the aliphatic organic group, and/or the alicyclic organic group in $Y^1$ and/or $Y^2$ of the above Chemical Formulae 4 and 5 may be a residual group of dicarboxylic acid or a residual group of a dicarboxylic acid derivative, respectively.

Examples of the dicarboxylic acid derivative may include without limitation 4,4'-oxydibenzoyl chloride, diphenyloxydicarbonyl dichloride, bis(phenylcarbonylchloride) sulfone, bis(phenylcarbonylchloride)ether, bis(phenylcarbonylchloride)phenone, phthaloyl dichloride, terephthaloyl dichloride, isophthaloyl dichloride, dicarbonyl dichloride, diphenyloxydicarboxylatedibenzotriazole, and the like, and combinations thereof.

Examples of $Y^1$ and/or $Y^2$ of the above Chemical Formulae 4 and 5 may include without limitation a linking group represented by the following Chemical Formulae 8 to 10, or a combination thereof.

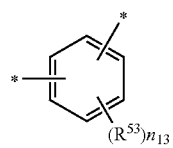

[Chemical Formula 8]

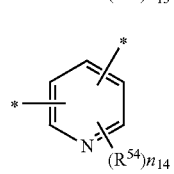

[Chemical Formula 9]

In Chemical Formulae 8 to 10, $R^{53}$ to $R^{56}$ are the same or different and are independently hydrogen or substituted or unsubstituted C1 to C30 alkyl, each $n^{13}$ and $n^{14}$ is the same or different and is independently an integer of 0 to 4, each $n^{15}$ and $n^{16}$ is the same or different and is independently an integer of 0 to 3, $A^2$ is a single bond, O, $CR^{47}R^{48}$, CO, CONH, S, or $SO_2$.

The polybenzoxazole precursor may have a weight average molecular weight of about 3,000 to about 300,000 g/mol, for example about 5,000 to about 30,000 g/mol. When the polybenzoxazole precursor has a weight average molecular weight within the above ranges, the composition may provide sufficient film residue ratios of non-exposed parts during development using an alkali aqueous solution, and patterning may be performed efficiently.

(C) Photosensitive Diazoquinone Compound

The photosensitive diazoquinone compound may be a compound having a 1,2-benzoquinone diazide structure or 1,2-naphtoquinone diazide structure.

The photosensitive diazoquinone compound may include a compound represented by the following Chemical Formulae 11 and 13 to 15, or a combination thereof, but is not limited thereto.

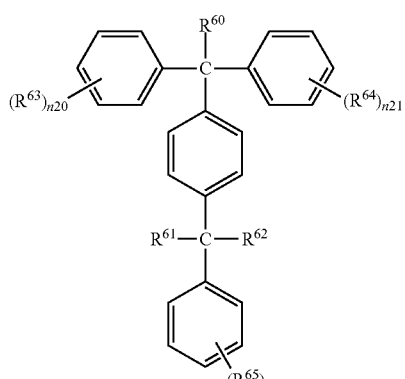

[Chemical Formula 11]

In Chemical Formula 11, $R^{60}$ to $R^{62}$ are the same or different and are each independently hydrogen or substituted or unsubstituted C1 to C30 alkyl, for example methyl, $R^{63}$ to $R^{65}$ are the same or different and are each independently OQ, wherein Q is hydrogen, a functional group represented by the following Chemical Formula 12a or a functional group represented by the following Chemical Formula 12b, provided that all Qs are not simultaneously hydrogen, and each $n^{20}$ to $n^{22}$ is the same or different and is independently an integer of 0 to 5.

[Chemical Formula 12a]

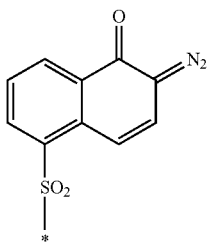

[Chemical Formula 12b]

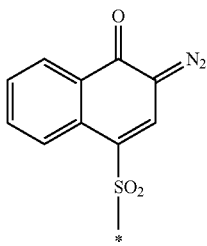

[Chemical Formula 13]

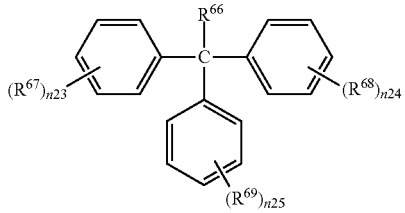

In Chemical Formula 13, $R^{66}$ is hydrogen or substituted or unsubstituted C1 to C30 alkyl, $R^{67}$ to $R^{69}$ are the same or different and are each independently OQ, wherein Q is the same as defined in the above Chemical Formula 11, and each $n^{23}$ to $n^{25}$ is the same or different and is independently an integer of 0 to 5.

[Chemical Formula 14]

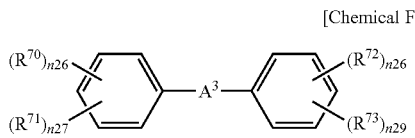

In Chemical Formula 14, $A^3$ is CO or $CR^{74}R^{75}$, wherein each $R^{74}$ and $R^{75}$ is the same or different and is independently substituted or unsubstituted C1 to C30 alkyl, $R^{70}$ to $R^{73}$ are the same or different and are independently hydrogen, substituted or unsubstituted C1 to C30 alkyl, OQ, or NHQ, wherein Q is the same as defined in Chemical Formula 11, each $n^{26}$ to $n^{29}$ is the same or different and is independently an integer of 0 to 4, and each $n^{26}+n^{27}$ and $n^{28}+n^{29}$ is the same or different and is independently an integer of less than or equal to 5.

provided that at least one of $R^{70}$ and $R^{71}$ is OQ, and one aromatic ring includes one to three OQs and the other aromatic ring includes one to four OQs.

[Chemical Formula 15]

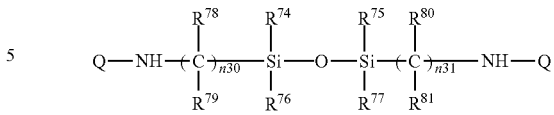

In Chemical Formula 15, $R^{74}$ to $R^{81}$ are the same or different and are each independently hydrogen or substituted or unsubstituted C1 to C30 alkyl, each $n^{30}$ and $n^{31}$ is the same or different and is independently an integer of 1 to 5, and Q is the same as defined in Chemical Formula 11.

The positive photosensitive resin composition may include the photosensitive diazoquinone compound in an amount of about 5 to about 100 parts by weight, for example about 10 to about 50 parts by weight, based on about 100 parts by weight of the polybenzoxazole precursor. In some embodiments, the positive photosensitive resin composition may include the photosensitive diazoquinone compound in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 48, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, or 100 parts by weight. Further, according to some embodiments of the present invention, the amount of the photosensitive diazoquinone compound can be in a range from about any of the foregoing amounts to about any other of the foregoing amounts.

When the positive photosensitive resin composition includes the photosensitive diazoquinone compound in an amount within the above range, the pattern can be well-formed with minimal or no residue from exposure, and film thickness loss during development may be prevented and thereby a good pattern can be provided.

(D) Solvent

The positive photosensitive resin composition may include a solvent that is capable of dissolving each component easily.

Examples of the solvent may include without limitation alkylene glycol alkyl ethers such as ethyleneglycol monomethylether, ethyleneglycol monoethylether, propyleneglycol monomethylether, propyleneglycol monoethylether, diethyleneglycoldimethylether, diethyleneglycoldiethylether, diethyleneglycoldibutylether, propyleneglycolmonomethylether, dipropyleneglycolmonomethylether, 1,3-butyleneglycol-3-monomethylether, and the like, alkyl acetates such as propyl acetate, butyl acetate, isobutyl acetate, and the like, ketones such as acetylacetone, methylpropylketone, methylbutylketone, methylisobutylketone, cyclopentanone, and the like, alcohols such as butanol, isobutanol, pentenol, 4-methyl-2-pentenol, and the like, aromatic hydrocarbons such as toluene, xylene, and the like, N-methyl-2-pyrrolidone, N-cyclohexyl-2-pyrrolidone, N,N-dimethyl formamide, γ-butyrolactone, N,N-dimethyl acetamide, dimethylsulfoxide, propyleneglycol monomethyletheracetate, methyl lactate, ethyl lactate, butyl lactate, methyl-1,3-butyleneglycolacetate, 3-methyl-3-methoxybutylacetate, methyl pyruvate, ethyl pyruvate, methyl-3-methoxy propionate, and the like, and combinations thereof. The solvent may be used singularly or as a mixture of two or more.

The solvent may be desirably selected according to a method of forming a photosensitive resin film such as spin coating, slit die coating, and the like.

The positive photosensitive resin composition may include the solvent in an amount of about 100 to about 900 parts by weight, for example about 200 to about 700 parts by weight, based on about 100 parts by weight of the alkali soluble resin. When the solvent is used in an amount within the above range, a sufficiently thick film can be obtained, and good solubility and coating can be provided.

In one embodiment, the solvent may be used so that a solid content of the positive photosensitive resin composition is about 3 to 50 wt %, for example about 5 to about 30 wt %.

(E) Other Additive(s)

The positive photosensitive resin composition according to one embodiment can further include one or more other additives.

The other additives may include a latent thermal acid generator. Examples of the latent thermal acid generator include without limitation arylsulfonic acids such as p-toluenesulfonic acid, benzenesulfonic acid, and the like; perfluoroalkylsulfonic acids such as trifluoromethanesulfonic acid, trifluorobutanesulfonic acids, and the like; alkylsulfonic acids such as methanesulfonic acid, ethanesulfonic acid, butanesulfonic acid, and the like; and the like, and combinations thereof.

The latent thermal acid generator is a catalyst for a dehydration reaction and a cyclization reaction of the polybenzoxazole precursor that is polyamide including a phenolic hydroxy group, and thus a cyclization reaction may be performed smoothly even if curing temperature is decreased.

In addition, the positive photosensitive resin composition may further include an additive such as a suitable surfactant and/or leveling agent to prevent a stain of the film or to improve development.

Exemplary processes for forming a pattern using a positive photosensitive resin composition includes: coating a positive photosensitive resin composition on a supporting substrate using spin coating, slit coating, inkjet printing, and the like; drying the coated positive photosensitive resin composition to provide a positive photosensitive resin composition layer; exposing the positive photosensitive resin composition layer; developing the positive photosensitive resin composition layer using an alkali aqueous solution to provide a photosensitive resin film; and baking the photosensitive resin film. The conditions of processes to provide a pattern are widely known in this art, so detailed descriptions thereof will be omitted in this specification.

According to another embodiment, an organic insulator film for a display device manufactured using the positive photosensitive resin composition is provided. The organic insulator film may be used in a display device, for example an organic light emitting device (OLED).

According to yet another embodiment, a semiconductor device including the organic insulator film is provided. The display device may be an organic light emitting device (OLED).

The following examples illustrate the present invention in more detail. However, it is understood that the present invention is not limited by these examples.

(Preparation of Dissolution Controlling Agent)

PREPARATION EXAMPLE 1

(1) 18.4 g of triethylamine is added into a solution of 15 g of 2-aminoethyl methacrylate hydrochloride (Aldrich) and 250 ml of anhydrous methylene chloride and mixed. The obtained mixture is agitated at room temperature for 1 hour and added with 15.3 g of trifluoromethane sulfonyl chloride and mixed. Then the mixture is agitated at room temperature for 24 hours. After adding about 200 ml of ether thereto, the mixture is filtered to remove the formed precipitate. The filtrate is cleaned with 300 ml of 2% HCl, 100 ml of saturated $NaHCO_3$, and 300 ml of salt water, sequentially and dried with $MgSO_4$. The solvent is removed by a rotary evaporator to provide about 14.5 g of liquid. The product is additionally purified by the recrystallization from hexane and chloroform (1:1 weight ratio) to provide about 12 g of a white solid.

(2) 7 g of white solid obtained from the step (1) and 10 g of hexafluoropropyl methacrylate are introduced into a flask under nitrogen atmosphere and added with 60 g of propylene glycol ether acetate to dissolve the solution and added with 5 g of 2,2'-azobisisobutyronitrile and agitated at 80° C. for 2 hours and cooled at room temperature. The obtained polymerization solution is dripped into heptanes in a dropwise fashion, and the precipitated solid is filtered to provide a polymer. The obtained polymer has a weight average molecular weight of 8,500 g/mol.

PREPARATION EXAMPLE 2

(1) 9 g of sodium hydroxide and 28 g of bicyclo[2,2,1]hept-5-ene-2-ethane amine in the equivalent mole are introduced into a flask containing 50 g of heptane and 100 g of distilled water and then agitated. While controlling the inner temperature lower than 10° C., 57 g of trifluoro methane sulfoic anhydride is added in a dropwise fashion for 1 hour and agitated at 50° C. for 1 hour. After the obtained reaction solution is separated into two layers, the organic layer is cleaned with 50 ml of 5% sulfuric acid aqueous solution and cleaned with 50 ml of distilled water two times. 18 g of borane, 9 g of peroxide water and 9 g of sodium hydroxide are added into the obtained reaction solution and then agitated for one hour, and added with 20 g of triethylamine and 25 g of methacryloyl chloride and agitated to provide a product.

(2) 7 g of the product obtained from the step (1) and 10 g of hexafluoropropyl methacrylate are introduced into a flask under the nitrogen atmosphere, and 60 g of propyleneglycol ether acetate is added thereto, and the solution is dissolved. Then 5 g of 2,2'-azobisisobutyronitrile is introduced thereto and then agitated at 80° C. for 2 hours and cooled at room temperature. The obtained polymerization solution is added to heptane in a dropwise fashion, and a precipitated solid is filtered to provide a polymer. The obtained polymer has a weight average molecular weight of 7,800 g/mol.

(Preparation of Polybenzoxazole Precursor)

PREPARATION EXAMPLE 3

While flowing nitrogen into a 4-necked flask equipped with an agitator, a temperature controller, a nitrogen injector, and a condenser, 12.4 g of 2,2-bis(3-amino-4-hydroxy phenyl)-1,1,1,3,3,3-hexafluoropropane and 125 g of N-methyl-2-pyrrolidone (NMP) are introduced and dissolved. When the solid is completely dissolved, 4.2 g of a pyridine catalyst is introduced thereto, and a solution that 9.4 g of 4,4'-oxy dibenzoylchloride is input and dissolved in 100 g of NMP is slowly added into the 4-necked flask in a dropwise fashion for 30 minutes while maintaining the temperature from 0 to 5° C. After completing the dropwise addition, the reaction is performed at 0 to 5° C. for 1 hour, and the reaction is carried out for 1 hour while increasing the temperature until reaching room temperature. 1.1 g of 5-norborene-2,3-dicarboxyl anhydride is introduced therein and agitated at 70° C. for 24 hours, and then the reaction is completed. The reaction mixture is input into a solution of water/methanol=10/1 (volume ratio) to provide a precipitate. The precipitate is filtrated and cleaned with water and then dried at a temperature of 80° C. under a vacuum for greater than or equal to 24 hours to provide a polybenzoxazole precursor.

PREPARATION EXAMPLE 4

A polybenzoxazole precursor is obtained in accordance with the same procedure as in Preparation Example 3, except using aconitic anhydride instead of 5-norborene-2,3-dicarboxyl anhydride.

PREPARATION EXAMPLE 5

A polybenzoxazole precursor is obtained in accordance with the same procedure as in Preparation Example 3, except using isobutenyl succinic anhydride instead of 5-norborene-2,3-dicarboxyl anhydride.

PREPARATION EXAMPLE 6

A polybenzoxazole precursor is obtained in accordance with the same procedure as in Preparation Example 3, except using 3,6-epoxy-1,2,3,6-tetrahydrophthalic anhydride instead of 5-norborene-2,3-dicarboxyl anhydride.

(Preparation of Positive Photosensitive Resin Composition)

EXAMPLES 1 to 16 and COMPARATIVE EXAMPLES 1 to 8

The positive photosensitive resin compositions according to Examples 1 to 16 and Comparative Examples 1 to 8 are obtained in the compositions shown in the following Table 1. Specifically, 10 g of polybenzoxazole precursors obtained from Preparation Examples 3 to 6 are mixed with 35 g of γ-butyrolactone (GBL) and dissolved, and then added with 3 g of photosensitive diazoquinone compound represented by the following Chemical Formula 16 and the dissolution controlling agents obtained from Preparation Examples 1 and 2 in an amount shown in the following Table 1 and dissolved, and then is filtered with a 0.45 μm fluoro resin filter to provide a positive photosensitive resin composition.

TABLE 1

| | Polybenzoxazole precursor(g) | | Photosensitive diazoquinone compound (g) | Dissolution controlling agent(g) | |
|---|---|---|---|---|---|
| Example 1 | Preparation Example 3 | 10 | 3.5 | Preparation Example 1 | 2 |
| Example 2 | Preparation Example 4 | 10 | 3.5 | Preparation Example 1 | 2 |
| Example 3 | Preparation Example 5 | 10 | 3.5 | Preparation Example 1 | 2 |
| Example 4 | Preparation Example 6 | 10 | 3.5 | Preparation Example 1 | 2 |
| Example 5 | Preparation Example 3 | 10 | 3.5 | Preparation Example 2 | 2 |
| Example 6 | Preparation Example 4 | 10 | 3.5 | Preparation Example 2 | 2 |
| Example 7 | Preparation Example 5 | 10 | 3.5 | Preparation Example 2 | 2 |
| Example 8 | Preparation Example 6 | 10 | 3.5 | Preparation Example 2 | 2 |
| Example 9 | Preparation Example 3 | 10 | 3.5 | Preparation Example 1 | 1.5 |
| Example 10 | Preparation Example 4 | 10 | 3.5 | Preparation Example 1 | 1.5 |
| Example 11 | Preparation Example 3 | 10 | 3.5 | Preparation Example 2 | 1.5 |
| Example 12 | Preparation Example 4 | 10 | 3.5 | Preparation Example 2 | 1.5 |
| Example 13 | Preparation Example 3 | 10 | 3.5 | Preparation Example 1 | 2.5 |
| Example 14 | Preparation Example 4 | 10 | 3.5 | Preparation Example 1 | 2.5 |
| Example 15 | Preparation Example 3 | 10 | 3.5 | Preparation Example 2 | 2.5 |
| Example 16 | Preparation Example 4 | 10 | 3.5 | Preparation Example 2 | 2.5 |
| Comparative Example 1 | Preparation Example 3 | 10 | 3.5 | — | — |
| Comparative Example 2 | Preparation Example 4 | 10 | 3.5 | — | — |
| Comparative Example 3 | Preparation Example 5 | 10 | 3.5 | — | — |
| Comparative Example 4 | Preparation Example 6 | 10 | 3.5 | — | — |
| Comparative Example 5 | Preparation Example 3 | 10 | 3.5 | Preparation Example 1 | 1.0 |
| Comparative Example 6 | Preparation Example 4 | 10 | 3.5 | Preparation Example 1 | 1.0 |
| Comparative Example 7 | Preparation Example 3 | 10 | 3.5 | Preparation Example 2 | 1.0 |
| Comparative Example 8 | Preparation Example 4 | 10 | 3.5 | Preparation Example 2 | 1.0 |

[Chemical Formula 16]

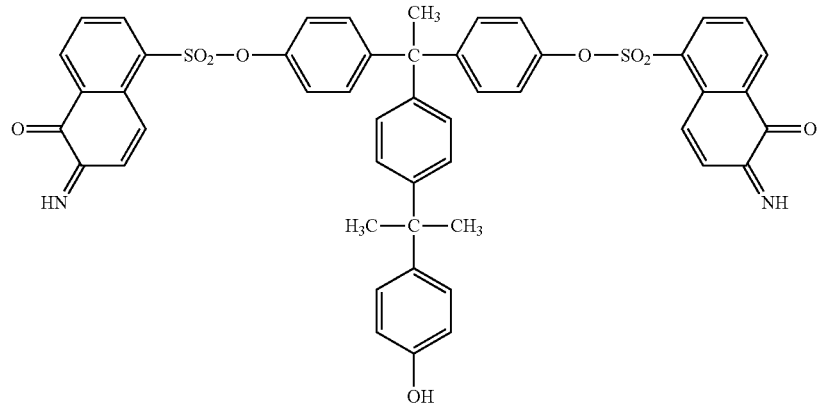

(Manufacture of Photosensitive Resin Film)

The positive photosensitive resin compositions obtained from Examples 1 to 16 and Comparative Examples 1 to 8 are coated on a 8-inch wafer using a spin coater of 1H-DX2 manufactured by Mikasa and then heated on a hot plate at 130° C. for 2 minutes to provide a photosensitive polybenzoxazole precursor film.

Using a mask patterned in the various sizes, the photosensitive polybenzoxazole precursor film is exposed by changing the exposure dose with a i-line stepper of NSR i10C manufactured by Japan Nikon, and then developed in a 2.38% tetramethylammonium hydroxide (TMAH) aqueous solution at room temperature for 40 seconds (2 puddles) to dissolve and remove the exposed part and then cleaned with pure water for 30 seconds to provide a pattern.

Evaluation 1: Measuring Optimal Energy ($E_{op}$)

Wafers coated with positive photosensitive resin compositions obtained from Examples 1 to 16 and Comparative Examples 1 to 8 are observed. The optimum energy for concisely patterning a line and space pattern having a line width of 5 μm is measured, and the results are shown in the following Table 2.

Evaluation 2: Measurement of Scum

The exposed parts of patterns obtained from Examples 1 to 16 and Comparative Examples 1 to 8 are observed by CD-SEM, and the results are shown in the following Table 2.

<Scum Evaluation Reference>

◯: target CD (critical dimension) is realized, but scum is present in the CD-SEM measurement X: target CD (critical dimension) is realized, and scum is not present in the CD-SEM measurement

TABLE 2

|  | $E_{op}$ (mJ/cm$^2$) | Scum |
| --- | --- | --- |
| Example 1 | 74 | X |
| Example 2 | 70 | X |
| Example 3 | 72 | X |
| Example 4 | 76 | X |
| Example 5 | 76 | X |
| Example 6 | 73 | X |
| Example 7 | 75 | X |
| Example 8 | 76 | X |
| Example 9 | 76 | X |
| Example 10 | 72 | X |
| Example 11 | 78 | X |
| Example 12 | 74 | X |
| Example 13 | 68 | X |
| Example 14 | 64 | X |
| Example 15 | 70 | X |
| Example 16 | 66 | X |
| Comparative Example 1 | 92 | ◯ |
| Comparative Example 2 | 90 | X |
| Comparative Example 3 | 94 | X |
| Comparative Example 4 | 95 | ◯ |
| Comparative Example 5 | 78 | ◯ |
| Comparative Example 6 | 82 | X |
| Comparative Example 7 | 84 | ◯ |
| Comparative Example 8 | 82 | X |

From Table 2, it is understood that Examples 1 to 16 in which the dissolution controlling agent is added to a positive photosensitive resin composition within a certain amount range according to one embodiment have higher sensitivity and excellent scum removal property compared to Comparative Examples 1 to 4 including no dissolution controlling agent and Comparative Examples 5 to 8 including the dissolution controlling agent in an amount out of the certain range in accordance with the invention.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A positive photosensitive resin composition, comprising:
   (A) at least one dissolution controlling agent comprising a compound including a repeating unit represented by the following Chemical Formula 1, a compound including a repeating unit represented by the following Chemical Formula 2, or a combination thereof;
   (B) a polybenzoxazole precursor;
   (C) a photosensitive diazoquinone compound; and
   (D) a solvent,
   wherein the dissolution controlling agent (A) is included in an amount of about 5 to about 35 parts by weight based on about 100 parts by weight of the polybenzoxazole precursor (B):

[Chemical Formula 1]

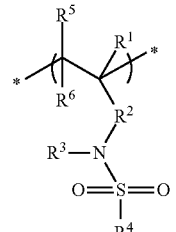

[Chemical Formula 2]

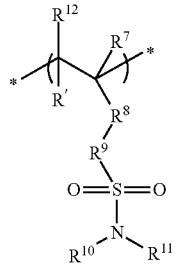

wherein, in Chemical Formulae 1 and 2, $R^1$, $R^5$, $R^6$, $R^7$, $R^{12}$ and R' are the same or different and are each independently hydrogen, substituted or unsubstituted C1 to C20 alkyl, or substituted or unsubstituted C1 to C20 fluoroalkyl, $R^2$ and $R^8$ are the same or different and are each independently —CO—, —COO—, —OCO—,—OCO—COO—, or substituted or unsubstituted C1 to C20 alkylene, $R^3$, $R^{10}$ and $R^{11}$ are the same or different and are each independently hydrogen, substituted or unsubstituted C1 to C20 alkyl, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, or substituted or unsubstituted C6 to C30 aryl, R[4] is substituted or unsubstituted C1 to C20 fluoroalkyl, and R[9] is substituted or unsubstituted C1 to C20 fluoroalkylene.

2. The positive photosensitive resin composition of claim 1, wherein the compound including the repeating unit represented by the above Chemical Formula 1, the compound including the repeating unit represented by the above Chemical Formula 2, or a combination thereof comprises about 1 to about 35 mol % of fluorine.

3. The positive photosensitive resin composition of claim 1, wherein the compound including the repeating unit represented by the above Chemical Formula 1, the compound including the repeating unit represented by the above Chemical Formula 2, or a combination thereof further comprises at least one repeating unit represented by the following Chemical Formulae 3-1 to 3-14, or a combination thereof:

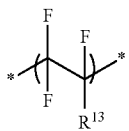

[Chemical Formula 3-1]

wherein, in Chemical Formula 3-1, R[13] is substituted or unsubstituted C1 to C20 fluoroalkyl,

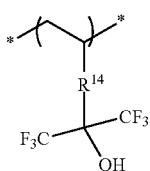

[Chemical Formula 3-2]

wherein, in Chemical Formula 3-2, R[14] is substituted or unsubstituted C1 to C20 alkylene,

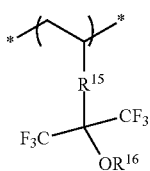

[Chemical Formula 3-3]

wherein, in Chemical Formula 3-3,
R[15] is substituted or unsubstituted C1 to C20 alkylene or substituted or unsubstituted C6 to C30 arylene, and
R[16] is substituted or unsubstituted C1 to C20 alkyl,

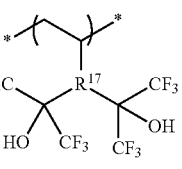

[Chemical Formula 3-4]

wherein, in Chemical Formula 3-4, R[17] is substituted or unsubstituted C3 to C20 cycloalkylene or substituted or unsubstituted C6 to C30 arylene,

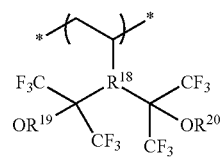

[Chemical Formula 3-5]

wherein, in Chemical Formula 3-5,
R[18] is substituted or unsubstituted C3 to C20 cycloalkylene or substituted or unsubstituted C6 to C30 arylene, and
R[19] and R[20] are the same or different and are independently substituted or unsubstituted C1 to C20 fluoroalkyl,

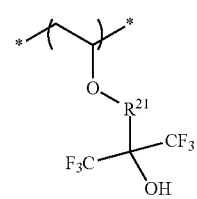

[Chemical Formula 3-6]

wherein, in Chemical Formula 3-6, R[21] is substituted or unsubstituted C1 to C20 alkylene, substituted or unsubstituted C3 to C20 cycloalkylene, or substituted or unsubstituted C6 to C30 arylene,

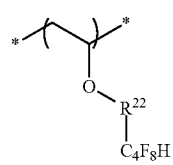

[Chemical Formula 3-7]

wherein, in Chemical Formula 3-7, R[22] is —R$_a$OR$^b$— wherein R$^a$ and R$^b$ are the same or different and are each independently substituted or unsubstituted C1 to C20 alkylene,

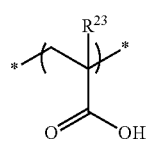

[Chemical Formula 3-8]

wherein, in Chemical Formula 3-8, R[23] is substituted or unsubstituted C1 to C10 fluoroalkyl,

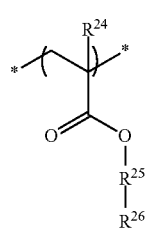

[Chemical Formula 3-9]

wherein, in Chemical Formula 3-9,
R$^{24}$ is hydrogen, substituted or unsubstituted C1 to C10 alkyl, or substituted or unsubstituted C1 to C 10 fluoroalkyl,
R$^{25}$ is single bond or substituted or unsubstituted C1 to C20 alkylene, and
R$^{26}$ is substituted or unsubstituted C1 to C20 fluoroalkyl,

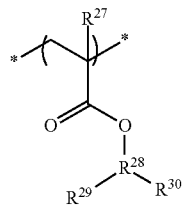

[Chemical Formula 3-10]

wherein, in Chemical Formula 3-10,
R$^{27}$ is hydrogen, substituted or unsubstituted C1 to C10 alkyl, or substituted or unsubstituted C1 to C 10 fluoroalkyl,
R$^{28}$ is substituted or unsubstituted C1 to C20 alkylene, and
R$^{29}$ and R$^{30}$ are the same or different and are each independently substituted or unsubstituted C1 to C20 fluoroalkyl,

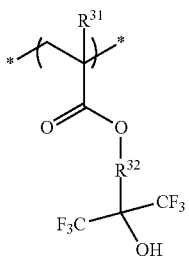

[Chemical Formula 3-11]

wherein, in Chemical Formula 3-11,
R$^{31}$ is hydrogen, substituted or unsubstituted C1 to C10 alkyl, or substituted or unsubstituted C1 to C 10 fluoroalkyl, and
R$^{32}$ is substituted or unsubstituted C1 to C20 alkylene, substituted or unsubstituted C1 to C20 fluoroalkylene, substituted or unsubstituted C3 to C20 cycloalkylene, substituted or unsubstituted C3 to C20 fluorocycloalkylene, substituted or unsubstituted C6 to C30 arylene, or substituted or unsubstituted C6 to C30 fluoroarylene,

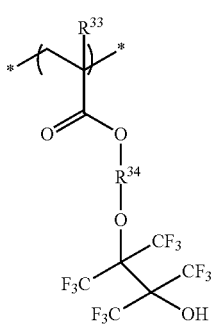

[Chemical Formula 3-12]

wherein, in Chemical Formula 3-12,
R$^{33}$ is hydrogen, substituted or unsubstituted C1 to C10 alkyl, or substituted or unsubstituted C1 to C 10 fluoroalkyl, and
R$^{34}$ is substituted or unsubstituted C1 to C20 alkylene,

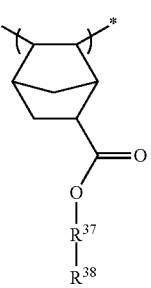

[Chemical Formula 3-13]

wherein, in Chemical Formula 3-13,
R$^{37}$ is substituted or unsubstituted C1 to C20 alkylene, and
R$^{38}$ is substituted or unsubstituted C1 to C20 fluoroalkyl,

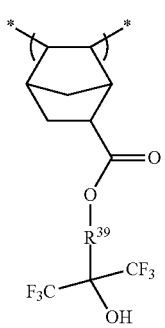

[Chemical Formula 3-14]

wherein, in Chemical Formula 3-14, R$^{39}$ is substituted or unsubstituted C1 to C20 alkylene.

4. The positive photosensitive resin composition of claim 1, wherein the dissolution controlling agent has a weight average molecular weight of about 3,000 to about 30,000 g/mol.

5. The positive photosensitive resin composition of claim 1, wherein the polybenzoxazole precursor comprises a repeating unit represented by the following Chemical Formula 4, a repeating unit represented by the following Chemical Formula 5, or a combination thereof:

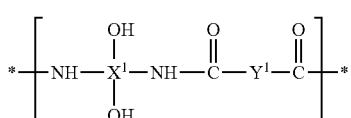

[Chemical Formula 4]

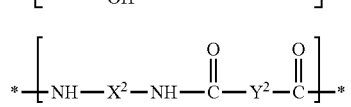

[Chemical Formula 5]

wherein, in Chemical Formulae 4 and 5,
each X$^1$ is the same or different and is independently a substituted or unsubstituted C6 to C30 aromatic organic group, a substituted or unsubstituted tetravalent to hexavalent C1 to C30 aliphatic organic group, or substituted or unsubstituted tetravalent to hexavalent C3 to C30 alicyclic organic group, each $X^2$ is the same or different and is each independently a substituted or unsubstituted C6 to C30 aromatic organic group, a substituted or unsubstituted divalent to hexavalent C1 to C30 aliphatic organic group, a substituted or unsubstituted divalent to hexavalent C3 to C30 alicyclic organic group, or an organic silane group, and $Y^1$ and $Y^2$ are the same or different and are each independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

6. The positive photosensitive resin composition of claim 1, wherein the polybenzoxazole precursor has a weight average molecular weight of about 3,000 to about 300,000 g/mol.

7. The positive photosensitive resin composition of claim 1, wherein the positive photosensitive resin composition comprises:
    about 5 to about 35 parts by weight of the dissolution controlling agent (A),
    about 5 to about 100 parts by weight of the photosensitive diazoquinone compound (C), and
    about 100 to about 900 parts by weight of the solvent (D), based on about 100 parts by weight of the polybenzoxazole precursor (B).

8. An organic insulator film for a display device manufactured by the process steps of coating the positive photosensitive resin composition of claim 1 onto a substrate; exposing the positive photosensitive resin composition; and developing the positive photosensitive resin composition.

9. A display device comprising the organic insulator film according to claim 8.

* * * * *

UNITED STATES PATENT AND TRADEMARK OFFICE
CERTIFICATE OF CORRECTION

PATENT NO.      : 8,956,790 B2
APPLICATION NO. : 13/933721
DATED           : February 17, 2015
INVENTOR(S)     : Jun-Ho Lee et al.

It is certified that error appears in the above-identified patent and that said Letters Patent is hereby corrected as shown below:

In the Specification

Column 2, Line 44 reads: "$R^3$, $R^{19}$ and $R^{11}$ are the same or different and are indepen-" and should read: "$R^3$, $R^{10}$ and $R^{11}$ are the same or different and are indepen-"

Column 5, Line 5 reads: "$R^{29}$ and $R^{39}$ are the same or different and are each indepen-" and should read: "$R^{29}$ and $R^{30}$ are the same or different and are each indepen-"

Column 17, Chemical Formula 14 is depicted as:

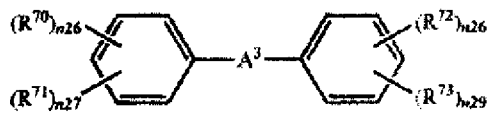

and should be depicted as:

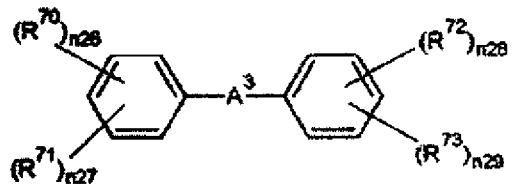

In the Claims

Claim 3 at Column 26, Line 40 reads: "wherein, in Chemical Formula 3-7, $R^{22}$ is -$R_a OR^b$-" and should read: "wherein, in Chemical Formula 3-7, $R^{22}$ is -$R^a OR^b$-"

Claim 3 at Column 27, Line 3 reads: "alkyl, or substituted or unsubstituted C1 to C 10 fluoro-" and should read: "alkyl, or substituted or unsubstituted C1 to C10 fluoro-"

Signed and Sealed this
Twenty-fifth Day of August, 2015

Michelle K. Lee
*Director of the United States Patent and Trademark Office*

CERTIFICATE OF CORRECTION (continued)
U.S. Pat. No. 8,956,790 B2

Claim 3 at Column 27, Line 22 reads: "alkyl, or substituted or unsubstituted C1 to C 10 fluoro-" and should read: "alkyl, or substituted or unsubstituted C1 to C10 fluoro-"

Claim 3 at Column 27, Line 44 reads: "alkyl, or substituted or unsubstituted C1 to C 10 fluoro-" and should read: "alkyl, or substituted or unsubstituted C1 to C10 fluoro-"

Claim 3 at Column 28, Line 3 reads: "alkyl, or substituted or unsubstituted C1 to C 10 fluoro-" and should read: "alkyl, or substituted or unsubstituted C1 to C10 fluoro-"